Feb. 13, 1968 J. T. GEORGE 3,368,949

PROCESS FOR ELECTROFORMING INLAID CIRCUITS

Filed June 10, 1963

NICKEL SHEET

APPLY PHOTO SENSITIVE RESIST

MASK AND EXPOSE TO LIGHT

DEVELOP

HEAT TO FORM OXIDE ON EXPOSED NICKEL

PLATE WITH SILVER, LEAVE RESIST

ADD ADHESIVE AND BOND TO INSULATING BACKING.

CHILL TO REMOVE NICKEL PLATE.

INVENTOR.
JACOB T. GEORGE
BY
Hillman, Smith & Lamb
ATTORNEYS 3,368,949
PROCESS FOR ELECTROFORMING INLAID CIRCUITS Jacob T. George, Baltimore, Md., assignor to The Bendix Corporation, Baltimore, Md., a corporation of Delaware
Filed June 10, 1963, Ser. No. 286,659
5 Claims. (Cl. 204—3)

ABSTRACT OF THE DISCLOSURE

A process for making electrical circuits inlaid into plastic backing boards. A master nickel plate has one side coated with a photoresist and subjected to light through a mask, whereby a latent image of the desired circuit pattern is produced in the photoresist. After the photoresist is developed to expose on the master plate the desired circuit pattern, the master plate is exposed to an oxidizing environment whereby a thin oxide film is produced on the exposed surface of the plate. An electroformed layer is then deposited on the exposed surface of the master plate. This electroformed layer, which is in the form of the desired circuit pattern, is then transferred to a plastic backing plate by sandwiching an adhesive between the master plate and the plastic backing plate, allowing the adhesive to cure, and then separating the backing plate from the master plate. The hardened photoresist, representing the spaces between the circuit tracks, having remained on the master plate, effectively prevents the adhesive from coming into contact with the nickel surface of the backing plate, thereby facilitating removal of the plastic backing plate with its inlaid circuit from the master plate.

Figure 1:
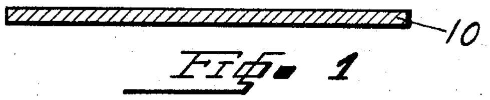

This invention is concerned with an improved process for the manufacture of inlaid printed circuits.

Where large quantities of duplicate circuits are needed it has become common practice to manufacture such circuits using printed circuit techniques. Such techniques are highly developed in the art, but many of them are not applicable to the manufacture of circuit boards wherein the conductor must be flush with the surface of the board. Such circuits are required where a movable electrical contact must travel over the surface of the board during its use. In many cases, the force required for moving the electrical contact member is limited and it is essential that the contact move smoothly across the board rather than sticking or skipping, thereby giving rise to erratic operation. A commonly used production method for manufacturing such flush circuits requires that a temporary foil of copper or similar conductive metal be coated with a thin layer of photosensitive resist material. A photo positive of the desired work is placed over the sensitized resist material and the assembly is subjected to a light source intense enough to thoroughly harden the desired areas of the work, these areas being those which become non-conductive areas in the final patterns. A prescribed solvent is used to remove the resist that has not been hardened by the light. The copper foil is then electroplated with the desired metal such as silver, gold, nickel or others. After plating the hardened photo resist material is removed, leaving the plated circuit pattern upstanding upon the copper backing material. This assembly is then laminated with the use of an adhesive to a material such as a phenolic sheet under combined heat and pressure. The resultant foil is then subjected to an etchant such as perchloride, chromic acid or ammonium persulfate. This etches away the copper backing material, leaving the final plated conductor pattern imbedded in the surface of the phenolic sheet. While the foregoing process works reasonably well, the cost of supplying the copper material and the etchant, both of which are effectively lost during the process, is very significant. This contributes substantially to the overall cost of producing circuit boards by this process. Other difficulties which have been experienced in using this process are concerned with damage to the plated conductor pattern caused either through irregularities in the copper plate itself which interfere with proper plating or through a buffing or finishing process sometimes required to provide a satisfactorily smooth surface. It is, therefore, an object of the present invention to provide a process for producing flush printed circuits without the necessity for using an etching step as part of the process for removal of a metallic base plate.

It is another object of the present invention to provide a process for producing flush or inlaid printed circuits which will provide a satisfactorily smooth surface without the necessity for including a vigorous buffing operation as a finishing step.

It is another object of the invention to provide an improved method of producing inlaid circuits which has the advantages specified above, while being accurate, reliable, and economical to employ.

Figure 6:
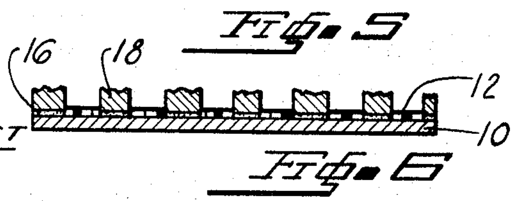
Figure 7:
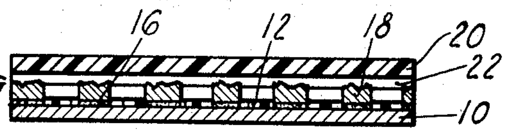
Figure 8:
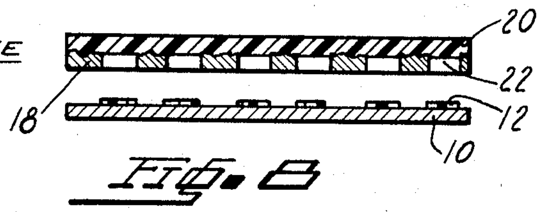

Other objects and advantages will become apparent from consideration of the following specification taken in connection with the accompanying drawings, in which:

FIG. 1 is a cross-sectional view of a metal plate employed in my invention as a temporary base plate;

FIGS. 2, 3, 4, 5, and 6 are views similar to FIG. 1, but illustrating succeeding steps in the formation of a printed circuit on the temporary base in accordance with my invention;

FIG. 7 is a similar view showing a permanent base added to the assembly of FIG. 6; and FIG. 8 is a view similar to FIG. 7, but showing the temporary base removed.

Figure 2:
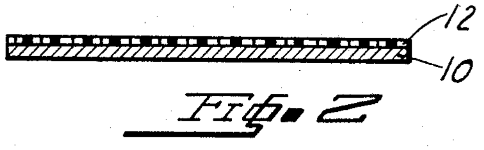
Figure 3:
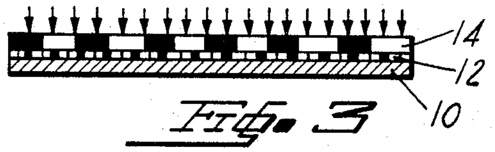

Referring now to FIG. 1, numeral 10 shows a cross-section of a temporary base plate used in my process. This base plate is preferably of nickel and may be of approximately 0.050 inch thickness. The thickness is not critical except insofar as is necessary to provide adequate stiffness without having excessive weight or bulk for personnel to handle. FIG. 2 shows the addition of a photosensitive resist 12 applied to the surface of plate 10. This layer of photosensitive resist may be applied by means of a whirling process to make the layer as even as possible, and heat is subsequently applied to dry the layer so that it is hard to the touch and remains in a sensitized condition. A mask 14 or photopositive of the desired pattern is placed over the sensitized resist and the assembly is subjected to a light source, intense enough to fully harden the resist material covering the areas which it is not desired to plate. The pattern so produced is then developed on the surface of the plate 10 by treating the surface with a solvent which removes the unhardened portions of the photo resist material thereby exposing on the surface of the plate 10 only the desired conductor pattern. The photographic masking process thus far described has been found to be very useful where extremely intricate conductor patterns are desired; however, any suitable masking technique may be used, depending upon requirements.

Figure 4:
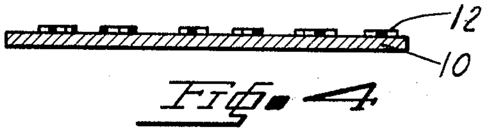

The base plate 10 with the conductor patterns appearing on its surface as shown in FIG. 4, after drying, is heat treated at 225° to 250° F. for approximately one hour in a forced air circulation oven. The purpose of this heat treating process is to produce a coat of oxide 16 over the exposed areas of the nickel plate 10, as shown in FIG. 5.

The plate 10 herein has been described as being of nickel and applicant has had excellent results using a plate of annealed nickel with a comparatively flat surface and at least of a cold roll finish. The coat of nickel oxide 16 produced on the surface of plate 10 has the desirable properties of having sufficiently good electrical conduction to conduct an electroplating current while forming a sufficiently weak mechanical bond between the nickel plate 10 and the conducting material plated to itself that the base plate 10 may be separated from the plated circuit pattern easily and cleanly without damage to the circuit pattern. The choice of material for the base plate 10 will depend upon requirements. Within reasonable limits, cost is not a serious factor because such plates may be used over and over again. The only requirement to assure satisfactory operation of the process is that the material be so chosen that by means of some simple process such as oxidation a film can be produced on the surface of said plate which is sufficiently conductive so that it will conduct a plating current, while providing only a weak mechanical bond between the plated material and the backing plate.

Figure 5:
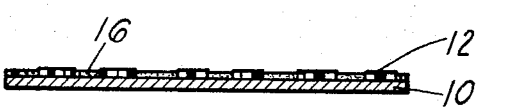

Following the formation of the nickel oxide film 16, the entire assembly of FIG. 5 is then immersed in an electrolytic bath containing a silver salt, and silver is electrolytically deposited on the exposed portions of the film 16. The silver so deposited on the nickel oxide film then constitutes the conducting portions 18 of the ultimate printed circuit and is in the desired configuration. (See FIG. 6.)

After the electroplated conductor pattern 18 is formed, the entire plate is rinsed of plating solution and allowed to dry.

The laminated plastic insulating base material 20 and the electroplated side of the assembly of FIG. 6 are placed on opposite sides of a layer of a thermo setting adhesive and the entire assembly is bonded together under heat and pressure to form the assembly shown in FIG. 7. Heat and pressure values which have been found successful are 325° F. to 350° F. for twenty minutes at approximately 1500 p.s.i. The assembly is then cooled to ambient temperature while still under pressure.

The assembly shown in FIG. 7 including the laminated base material and the metal base plate 10 is then, preferably, quickly cooled in a liquid or air to at least −40° C. The contraction of the metal plate 10 due to this temperature change is substantially greater than that of the other materials, rupturing the bond formed by the film 16 and causing plate 10 to be separated from the remaining part of the assembly carrying with it the residue of photosensitive resist material. Contrary to the practice in earlier processes, I have found that it is preferable not to remove the hardened photosensitive resist material 12 after the plating step (FIG. 6), because this material effectively prevents the adhesive layer 22 from bonding to the plate 10.

After cleaning, the nickel base plate 10 is then again ready for use. The residue of photo resist material may be removing chemically, by buffing or, alternatively, one can immerse the metal plate in a solution of a dilute alkaline cleaner (sodium hydroxide, potassium hydroxide) and by using electrical current of the polarity opposite to that used during plating the resist is easily and completely removed. This has an advantage over the buffing step because during buffing minute quantities of the resist material appear to be forced into the surface of the nickel plate and wherever this occurs subsequent efforts to electroplate the conducting material to this spot may be unsuccessful.

While only a single embodiment of the invention has been shown and described in detail herein, it will be understood that the invention is not limited thereto since many modifications may be made and it is, therefore, contemplated to cover, by the appended claims, any such modifications as fall within the true spirit and scope of the invention.

The invention claimed is:

1. A process for producing an inlaid circuit which comprises, providing a metal plate having at least one surface of nickel, coating said nickel surface with a photosensitive resist material, masking said plate and exposing said unmasked portion of said material to light causing said material to harden in a pattern which is a reverse negative of the desired circuit pattern, removing the unhardened photo resist material to expose the desired circuit pattern on the surface of said plate, exposing said plate to a forced air circulation environment at a temperature of 225° F. to 250° F. for approximately one hour to produce a significant nickel oxide layer on the pattern so exposed, electroplating said plate with a conducting metallic material whereby said material is deposited on said circuit pattern, applying adhesive to the electroplated surface of said plate and to said hardened photo resist mask whereby said adhesive is separated from and prevented from adhering to said nickel surface by said photo resist mask and bonding said plate to a plate of plastic insulating material, and separating the metal plate from the plastic insulating plate, leaving the plated circuit pattern imbedded in the surface of said plastic insulating plate.

2. A process for producing an inlaid circuit which comprises coating a nickel plate with a photosensitive resist material, masking said coated plate and exposing the unmasked portion of said material to light causing said material to harden in a pattern which is a reverse negative of the desired circuit pattern, removing the unhardened photo resist material to expose the desired circuit pattern on the surface of said plate, exposing said plate in a forced air circulation environment to a temperature of 225° F. to 250° F. for approximately one hour so as to produce a nickel oxide layer on the pattern so exposed, electroplating said plate with a conducting metallic material whereby said material is deposited on said circuit pattern, applying adhesive to the electroplated surface of said plate and to said hardened photo resist mask whereby said adhesive is separated from and prevented from adhering to said base plate by said photo resist mask and bonding said plate to a plate of plastic insulating material, and chilling the plate thus assembled to produce a thermal rate of change sufficient to separate the nickel plate from the plastic insulating plate, leaving the plated circuit pattern embedded in the surface of said plastic insulating plate.

3. A process for producing an inlaid circuit which comprises, applying a masking material to a nickel plate in a pattern which is the reverse of the desired circuit pattern, subjecting the mask plate to a forced air circulation environment at a temperature of 225° F. to 250° F. for approximately one hour to produce a significant oxide layer on the pattern so exposed, electroplating said plate with a conducting material whereby said conducting material is deposited on the oxide layer formed on said nickel plate, applying an adhesive to the electroplated surface of said plate and bonding said plate to a plate of plastic insulating material, and separating the nickel plate from the plastic insulating plate, leaving the plated circuit pattern imbedded in the surface of said plastic insulating plate.

4. A process for producing an inlaid circuit which comprises, producing by oxidation on a nickel surface an oxide film which is sufficiently conductive that it will conduct a plating current but which will form only a weak mechanical bond between material plated thereto and said nickel surface, applying a masking material to said nickel surface in a pattern which is the reverse of the desired circuit pattern, electroplating said nickel surface with a conducting material whereby said conducting material is deposited on said oxide film, applying an adhesive to the electroplated surface of said nickel surface and to said masking material and bonding said adhesive coated surface to a plate of plastic insulating material, and separating the plated circuit pattern and the plastic plate from said nickel surface, whereby the plated circuit pattern remains embedded in the surface of said plastic insulating plate.

5. A process for producing an inlaid circuit which comprises, subjecting a nickel plate to a forced air circulation environment at a temperature of 225° F. to 250° F. for approximately one hour, applying a photo resist to said nickel plate in a pattern which is the reverse of the desired circuit pattern, electroplating said nickel plate with a conducting material whereby said conducting material is deposited in a pattern of the desired circuit pattern, applying an adhesive to the electroplated surface of said plated nickel plate and said photo resist whereby said adhesive is separated from and prevented from adhering to said nickel plate by said photo resist and bonding said nickel plate to a plate of plastic insulating material, and separating the plated circuit pattern and the plastic plate from said nickel plate, whereby the plated circuit pattern remains embedded in the surface of said plastic insulating plate.

References Cited

UNITED STATES PATENTS

| | | | |
|---|---|---|---|
| 2,666,008 | 1/1954 | Enslein et al. | 154—94 |
| 2,874,085 | 2/1959 | Brietzke | 154—94 |
| 1,792,082 | 2/1931 | Fink et al. | 204—37 X |
| 1,963,834 | 6/1934 | Decker | 204—15 X |
| 2,221,502 | 6/1939 | Van de Pol | 204—11 |
| 2,984,595 | 5/1961 | Schumpelt et al. | 204—4 |

FOREIGN PATENTS

| | | |
|---|---|---|
| 3,222 | 1889 | Great Britain. |

OTHER REFERENCES

Murphy E. B., Electronics, Sept. 11, 1959, pp. 114–117.

HOWARD S. WILLIAMS, *Primary Examiner.*

JOHN H. MACK, *Examiner.*

W. VAN SISE, *Assistant Examiner.*